United States Patent [19]

Kanda et al.

[11] Patent Number: 4,705,102
[45] Date of Patent: Nov. 10, 1987

[54] BOILING REFRIGERANT-TYPE COOLING SYSTEM

[75] Inventors: Atsushi Kanda; Kazuo Kitani, both of Hyogo; Kiichirou Shirai, Kanagawa, all of Japan

[73] Assignees: Fuji Electric Company, Ltd., Kanagawa; Sumitomo Precision Products Co., Ltd., Hyogo, both of Japan

[21] Appl. No.: 808,658

[22] Filed: Dec. 13, 1985

[51] Int. Cl.$^4$ ............................................. H01L 23/44
[52] U.S. Cl. ..................... 165/104.33; 165/104.21; 165/167; 361/385
[58] Field of Search ...................... 165/104.33, 104.21, 165/153, 167, 110; 361/385

[56] References Cited

U.S. PATENT DOCUMENTS 2,782,010  2/1957  Simpelaar ........................... 165/167
3,805,889  4/1974  Coolidge ........................... 165/153
4,027,728  6/1977  Kobayashi et al. .

FOREIGN PATENT DOCUMENTS 8105233.2  7/1981  Fed. Rep. of Germany .
3132112    3/1982  Fed. Rep. of Germany .
60-111879  7/1985  Japan .

Primary Examiner—Albert W. Davis, Jr.
Attorney, Agent, or Firm—Finnegan, Henderson, Farabow, Garrett and Dunner

[57] ABSTRACT

A boiling refrigerant-type cooling system for cooling an electric apparatus includes a refrigerant containing chamber in which the electric apparatus is disposed, a condensing chamber, and a vapor reservoir all in flow communication with each other. A cooling chamber open to the atmosphere adjoins the condensing chamber. A laminated partition separates the cooling chamber from the condensing chamber. The electric apparatus is electrically connected through a sealed opening in the refrigerant containing chamber.

3 Claims, 12 Drawing Figures

BOILING REFRIGERANT-TYPE COOLING SYSTEM

BACKGROUND OF THE INVENTION

1. Field of the Invention

The present invention relates to a boiling refrigerant-type cooling system. More particularly, the invention relates to a cooling system designed to cool an electric apparatus such as a semiconductor stack by dipping the electric apparatus into a boiling refrigerant enclosed in an airtight container. The circulation of the refrigerant which is accompanied by a vapor-liquid phase change cools the refrigerant.

Description of the Related Art

Boiling refrigerant-type cooling systems as shown in FIGS. 7 and 8 are known in the art. In FIG. 7, an electric apparatus 6 such as a semiconductor stack, which is likely to become a heat source, is completely dipped in a boiling refrigerant 7 that is stored in the boiling refrigerant section 1 of the airtight container 18. The electric apparatus 6 is held so that it may remain in the boiling refrigerant section 1. The leads of the electric apparatus 6 are led out through airtight terminals 5 which adjoin the boiling refrigerant section 1 of the airtight container 18. Above the boiling refrigerant section 1 of the airtight container are installed condensing refrigerant chambers 8 equipped with heat exchanger fins 15. When the refrigerant 7 absorbs the heat loss of the electric apparatus 6, it boils and enters the vapor phase. The vaporized refrigerant then flows into a condensing refrigerant section 2 of the airtight container 18 where it passes around the heat exchanger fins 15, and into an air reservoir 10 located above the condensing refrigerant chambers 8. The outer walls of the condensing refrigerant chambers 8 are so arranged as to adjoin the cooling chambers 9 which contact the vaporized refrigerant. The cooling chambers 9, containing heat exchanger fins 13, are provided with openings on both sides thereof for allowing the outside air to flow therethrough. An electrically insulating material such as freon 113 is used as the boiling refrigerant because high voltage is applied to the electric apparatus inside the boiling refrigerant section 1.

In the boiling refrigerant cooling system constructed as described above, the loss heat from the electric apparatus is released in the outside air when the apparatus is cooled by the boiling refrigerant 7 which circulates in the airtight container. When heat transfers from the electric apparatus 6 to the refrigerant 7, boiling of the refrigerant 7 occurs where the loss heat of the electric apparatus radiates from the electric apparatus. Heat transfer from the vaporized refrigerant occurs with condensation of the vapor in the condensing refrigerant chambers 8 and with convection from the vaporized refrigerant to the heat exchanger fins 13 of the cooling chambers 9. Cooling systems employing a phase changing refrigerant must be made airtight to secure the cooling capacity of the system over a long period of time. The airtightness of the cooling system is normally kept at $10^{-7}$ atm. cc/sec or lower in terms of a leakage, provided that parts of the airtight container are welded or soldered.

In order to maintain the aforementioned airtightness, an upper header 4 and a lower header 3 are respectively welded to the body 2a of the condensing refrigerant section 2 and then the combination is welded to the boiling refrigerant section 1. The airtight terminals 5 for leading the leads of the electric apparatus 6 into the boiling refrigerant section 1 are then arranged with and welded to the boiling refrigerant section 1. The air reservoir 10 formed inside the upper header 4 of the condensing refrigerant section 2 communicates with each of the groove-shaped condensing refrigerant chambers 8 which are divided by the cooling chambers 9. The pressure within the airtight container 18 is thus made uniform to prevent a reduction in the condensing capacity of the condensing refrigerant section 2 due to a trace of air unavoidably penetrating into the airtight container during the use of the cooling system for a long period of time.

The condensing refrigerant chambers 8 and the cooling chambers 9 within the condensing refrigerant section 2 are arranged as shown in FIG. 8. The cooling chambers 9 have groove-like shaped surfaces and a heat exchanger fin 13 for passing the air internally and horizontally. The chambers 9 open to the outside air on both sides of the condensing refrigerant section 2. The condensing refrigerant chambers 8 also have a groove-like surface and a heat exchanger fin 15 which form a passage for passing vaporized refrigerant internally and vertically. The chambers 8 and 9 are alternately partitioned with partition boards 11. In addition, closing members 12 and 14 are used to close the upper and lower sides of the cooling chambers 9 and the front and rear sides of the condensing refrigerant chambers 8 to restrict each chamber to single direction flow.

The heat exchanger fins 13 and 15, the partition boards 11 and the closing members 12 and 14 are made of aluminum to decrease the weight of the cooling system as a whole and to improve the heat exchanging characteristics of the condensing refrigerant chambers 8 and the cooling chambers 9. In order to improve product quality control further, the partition boards 11 may be prepared from brazing material, i.e., aluminum core material claded with brazing filler metals, and then used to construct the condensing refrigerant chambers 8 and the cooling chambers 9. The combination thus constructed is heated and cooled in a salt bath or furnace under predetermined conditions to braze the junctions of the aforementioned members at one time.

Although the condensing refrigerant chambers 8 and the cooling chambers 9 in the airtight container of the boiling refrigerant cooling system thus constructed are brazed at one time, the remaining parts of the airtight container are joined by normal welding processes. The formation of the boiling refrigerant section 1, the joining of the body 2a and the headers 3 and 4 in the condensing refrigerant section 2, and the joining of the boiling refrigerant section 1 and the condensing refrigerant section 2 are all completed with a normal welding process. Accordingly, the manual welding operations, which require a significant skilled labor input, reduce airtightness reliability because of welding distortion and bubbles or because of foreign matter penetration into the airtight container. As a result, the benefit of simultaneous member-brazing will be largely lost and economy will be reduced, particularly when similar products are mass-produced.

Extreme high airtightness is required for the airtight container of a boiling refrigerant cooling system to prevent boiling refrigerant leakage and outside air penetration. Additionally, it is essential to prevent noxious foreign matter from mixing with the charged body of the electrical apparatus. Finally, effective quality control and low production cost are desirous, particularly when the boiling refrigerant-type systems are mass-produced.

In view of the shortcomings inherent in conventional boiling refrigerant type cooling systems as described above, it is an object of the present invention to provide a boiling refrigerant-type cooling system wherein all members are prepared from a material coated with solder and formed into desired shapes and the members are joined airtightly and simultaneously under stable conditions to construct an airtight container for a boiling refrigerant-type cooling system. It is a further object of the present invention to produce a cooling system that may be mass-produced under high quality control conditions to produce a highly reliable system with reduced labor, and thus production costs.

SUMMARY OF THE INVENTION

In order to achieve the above objects, the present invention provides a boiling refrigerant type cooling system for cooling an electric apparatus. The system has an airtight refrigerant containing chamber in which the electric apparatus is disposed, an airtight refrigerant condensing chamber in flow communication with the refrigerant containing chamber, an airtight vapor reservoir in flow communication with the airtight condensing chamber, and a cooling chamber that is open to the atmosphere. The refrigerant containing chamber has a sealed opening through which the electric apparatus is electrically connected. The cooling chamber and the airtight condensing chamber adjoin one another and are separated from each other by a laminated partition. The laminated partition has an upper and lower opening which form integral parts of the respective airtight reservoir and the refrigerant containing chamber. It is preferred that the laminated partition be comprised of a brazing material. It is further preferred that the condensing chamber and the cooling chamber each include a heat exchanger fin.

The accompanying drawings, which are incorporated in and constitute a part of this specification, illustrate presently preferred embodiments of the invention and, together with the description, serve to explain the principles of the invention.

PREFERRED EMBODIMENT OF THE INVENTION

Figure 1:
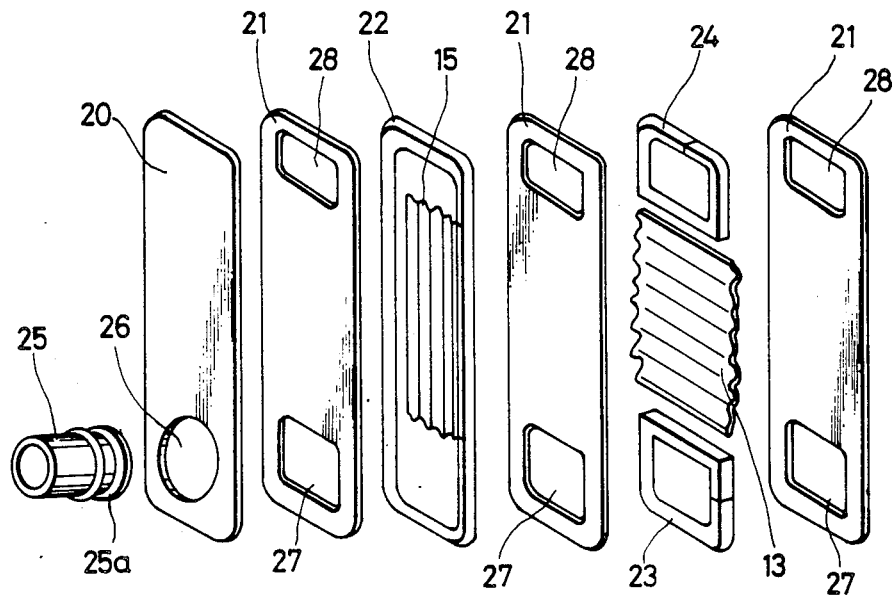
FIG. 1 is a perspective view illustrating the components of a boiling refrigerant-type cooling system constructed according to the present invention.

Reference will now be made in detail to a presently preferred embodiment of the invention, an example of which is illustrated in the accompanying drawings. Throughout the drawings, like reference characters are used to designate like elements.

Figure 2:
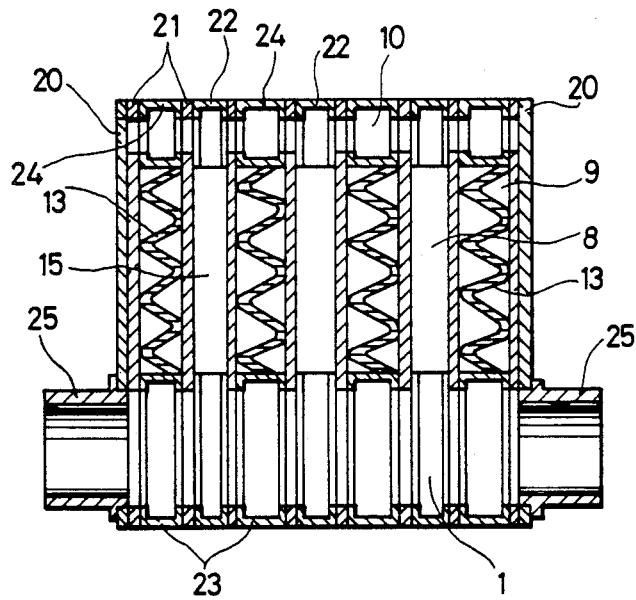
FIG. 2 is a schematic vertical cross-sectional view of the cooling system of FIG. 1.

A frame 22 prepared from bar-shaped material abutting one face of a plate-like partition board 21 is shown in FIGS. 1 and 2. Two frames 23 and 24, also prepared from bar-shaped material, abut the other face of the partition board 21 with the frames 23, 24 being arranged adjacent to the upper and lower portions of partition board 21, respectively. A corrugated heat exchanger fin 15 formed of a thin plate is so arranged in the frame 22 as to pass refrigerant vertically therethrough, while a corrugated heat exchanger fin 13 formed of a thin plate is arranged between the frames 23, 24 to pass air horizontally therethrough. To form the laminated body of a cooling system, a fixed number of the unit combinations of partition boards 21, frames 22, 23, 24 and heat exchanger fins 13, 15 are aligned with each other. Both ends of the laminated body formed from the unit combinations are sandwiched between and supported by side boards 20. A condensing refrigerant chamber 8 made airtight by the frame 22 houses the heat exchanger fin 15. A cooling chamber 9 having openings open to the outside air on both sides houses the heat exchanger fin 13. The condensing refrigerant chambers 8 and the cooling chambers 9 are arranged alternately with each other.

Of the aforementioned members, at least the partition boards 21, and the frames 22, 23, 24, are prepared from brazing material, i.e., aluminum core material precoated with solder. The laminated body composed of the aforementioned members which are sandwiched between the side boards 20 is heated and cooled in suitable brazing furnace such as a vacuum brazing furnace. Under predetermined conditions the interconnected members are simultaneously brazed.

The opening 28 in the upper portion of each partition board 21, a space above each condensing refrigerant chamber 8 above the heat exchanger fin 15 inside the frame 22, and the internal space of each frame 24 combine to constitute an air reservoir 10 which extends through the laminated body in the direction of lamination. The opening 27 in the lower portion of each partition board 21, a space below each condensing refrigerant chamber 8 below the heat exchanger fin 15 inside the frame 22, and the internal space of each frame 23 combine to constitute an internal chamber boiling refrigerant section 1 which extends through the laminated body in the direction of lamination. The air reservoir 10, the internal chamber of the boiling refrigerant section 1, and the condensing refrigerant chamber 8 together constitute an airtight container 19.

Openings 26 in the lower portions of the side boards 20 communiate with the internal chamber of the boiling refrigerant section 1. Outlets 25, i.e., pipes, are fitted into the openings 26. The outlets 25 can be fitted and brazed simultaneously with the laminated body by abutting the outlets 25 against the side board openings 26 with a ring plate 25a, prepared from brazing material or solder, that is sandwiched therebetween before the outlets and laminated body are simultaneously brazed. The leads of an electric apparatus (not shown), that is fixed by proper means within the internal chamber boiling refrigerant section 1, are led out through the outlets 25.

To complete the boiling refrigerant-type cooling system for an electrical apparatus, the internal chambers of the boiling refrigerant section 1 are filled with a fixed amount of refrigerant such as freon 113 and airtight terminals (not shown) are used to airtightly close the outlets 25. With the boiling refrigerant-type cooling system thus constructed, the loss heat from the electric apparatus, which is fixed and held in the internal chamber of the boiling refrigerant section 1, is passed to the outside air. The electric apparatus is cooled when the boiling refrigerant circulates in the airtight container where it undergoes vapor-liquid phase changes. When the refrigerant contacts the electric apparatus, boiling occurs and heat transfers from the electric apparatus to the refrigerant. Heat then transfers from the refrigerant to the outside air when vaporized refrigerant is condensed in the condensing refrigerant chambers 8 and when convective heat transfers from the vaporized refrigerant to the heat exchanger fins 13 of the cooling chambers 9.

The frames 22, 23, 24 must be of a seamless closed-loop type. Such seamless closed-loop frames can be obtained from drawn or extruded pipes having the same cross-sectional configurations as those of the desired frames, the pipes being cut in desired thickness.

Figure 3A:
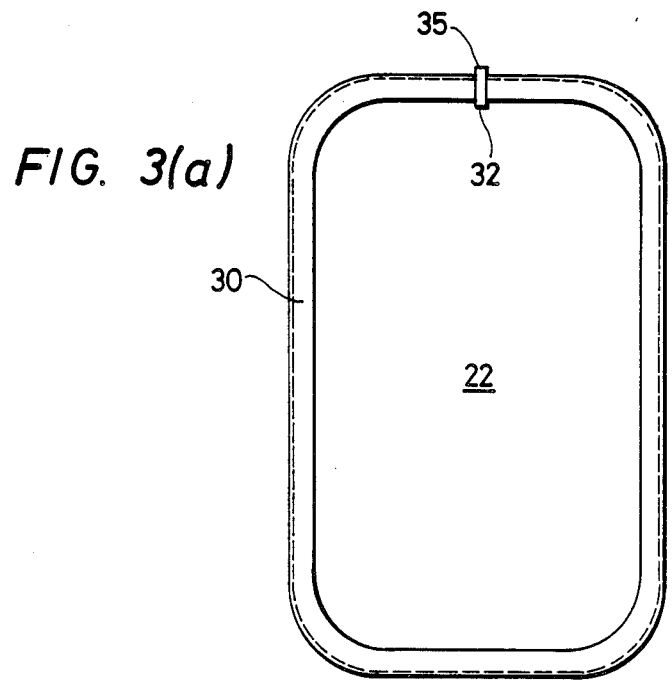
FIGS. 3(a), 3(b), 4(a), 4(b), 5(a) and 5(b) are schematic elevational views of frames that are part of the embodiment of FIG. 1.
Figure 3B:
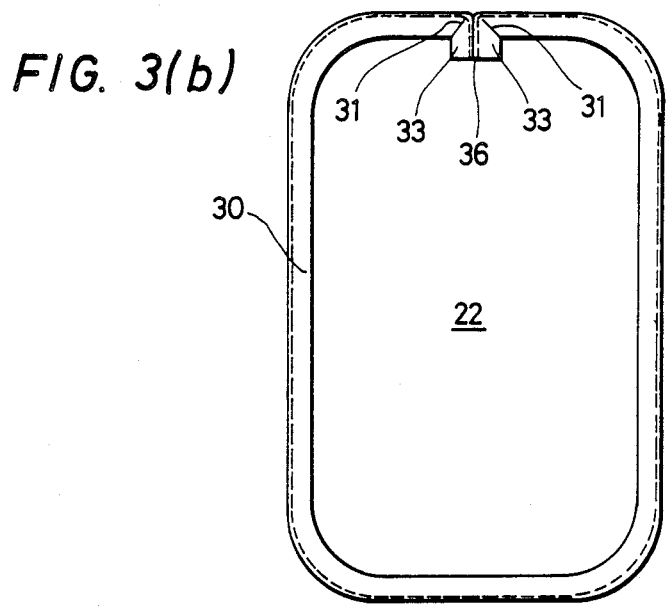

When bars are used to form the frames 22, 23, 24, bar 30, as shown in FIGS. 3, 4 and 5 is bent into a properly shaped closed loop so that both ends abut each other after which the abutting end portions are brazed. The frames may be formed easily and safely if a cut is made in the bend as illustrated in FIG. 3(b) when the bar 30 is bent perpendicularly.

Figure 4A:
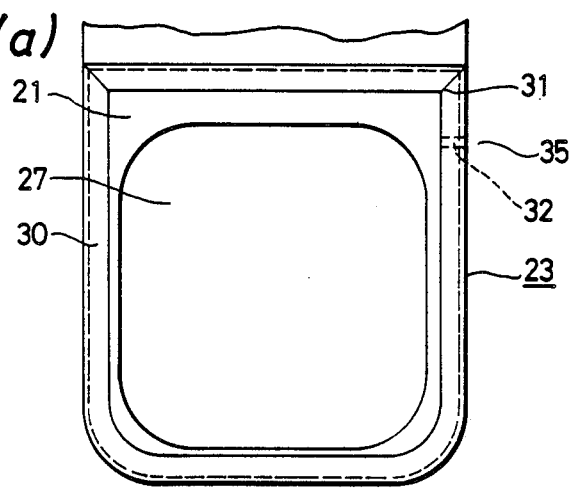
Figure 4B:
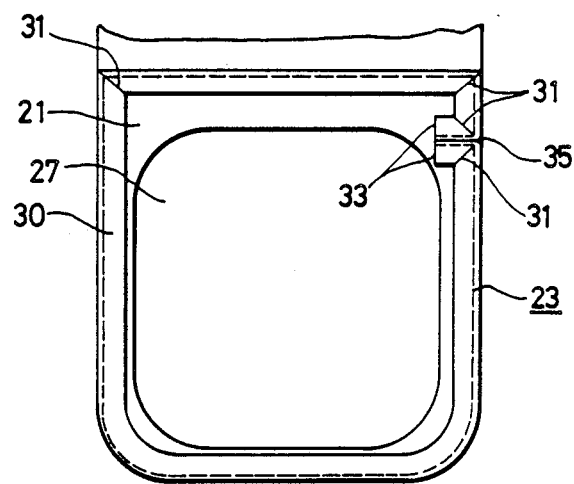
Figure 5A:
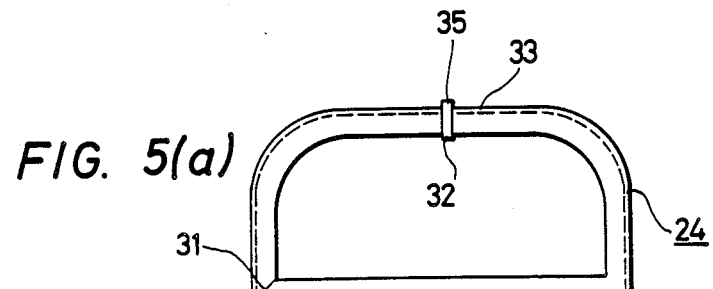
Figure 5B:
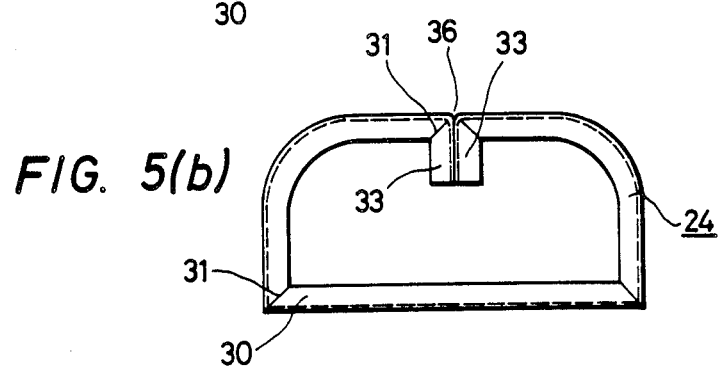

With respect to joining abutting end portions of each frame, it is possible to braze them after inserting a junction piece 32, that is preferably prepared from the same brazing material that comprises the partition board 21 as shown in FIGS. 3(a), 4(a) and 5(a). The abutting ends may be otherwise joined by bending both ends of the bar 30 inwardly and perpendicularly to provide desired overlap length and then brazing the abutting portions 36 as shown in FIGS. 3(b), 4(b) and 5(b).

Figure 6A:
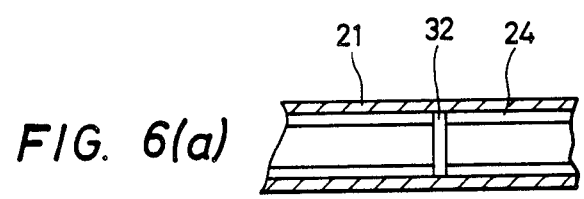
FIGS. 6(a) and 6(b) are transverse sectional views illustrating the junctions between the frames and boards shown in FIG. 1.
Figure 6B:
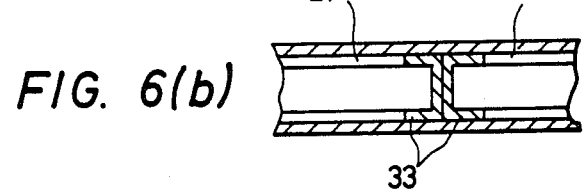
Figure 7:
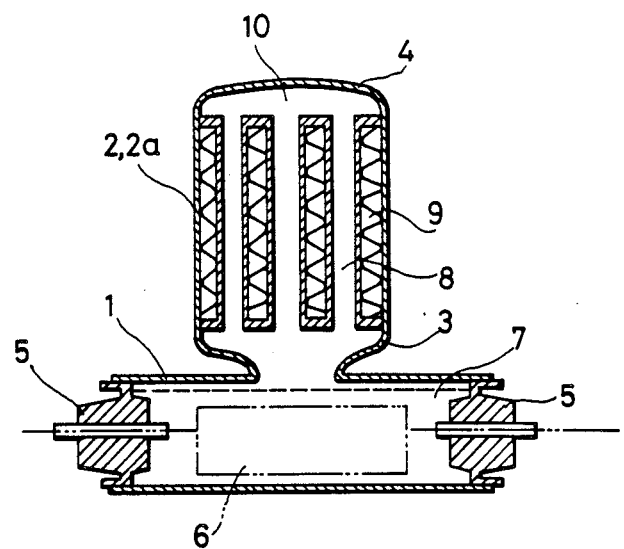
FIG. 7 is a vertical sectional view of a conventional boiling refrigerant-type cooling system.
Figure 8:
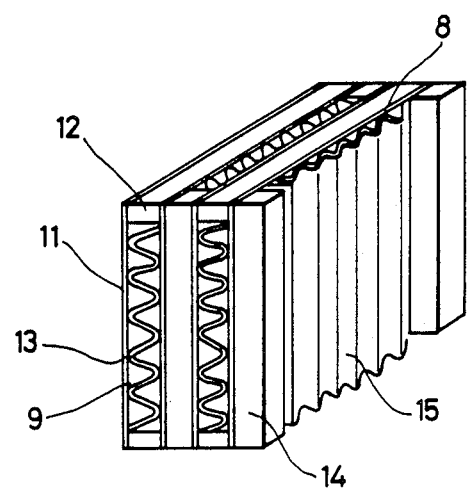
FIG. 8 is a perspective view outlining the condensing section of the system illustrated in FIG. 7.

As shown in FIGS. 6(a) and 6(b), a very small gap, if any, in the cut 31, may exist between the abutting portions 35 or 36 of the frame. However, an advantage of this invention is that the gap will be filled with solder supplied from both the frames and partition board during brazing work since both the frames 22, 23, 24 and the partition board 21 are made of brazing material in order to ensure the brazing of these portions.

In the airtight container formed in the laminated body, the internal chamber of the boiling refrigerant section 1 contains the electric apparatus being cooled. The internal chamber of the boiling refrigerant section 1 must have a cubic volume large enough to dip the electric apparatus in the boiling refrigerant while maintaining an insulating distance between the electric apparatus and the walls of the internal chamber.

The stress produced on the frame 23 may increase to a greater extent when the internal pressure in the internal chamber increases. For that reason, the configuration, dimension and corner radius of the opening 27 of the partition boards 21 are selected so that, as shown in FIG. 4, the stress existing in the cut 31 of the frame 23 may be used to reinforce the associated portion.

When frames 22, 23, 24 are formed from a groove-shaped bar material of thin plate coated with solder, the adiabatic deformation of each frame being formed is smaller than that of unprocessed material. This minimizes the reduction in the flatness of brazed layers, i.e., the frames constituting the laminated body, which prevents the overlap width for brazing from decreasing, while also allowing the frame to be fit well with the partition board 21 or side boards 20, both prepared from the brazing material. Because a slight dimensional error, if any, can be absorbed, the invention has the advantage that a number of members having complicated configurations may be combined to form an airtight container.

As set forth above, the boiling refrigerant type cooling system of the present invention will cool an electric apparatus such as a semiconductor stack. For cooling to occur, the electric apparatus is dipped into a boiling refrigerant that is enclosed in boiling refrigerant section 1. The circulation of the refrigerant within the airtight container 19 and the refrigerant's vapor-liquid phase change, combine to cool the electrical apparatus. Refrigerant vapor condenses in the refrigerant condensing chamber 8 formed from a frame 22 arranged against one face of a partition board 21. Two frames 23, 24 are arranged along the upper and lower portions of the other face of the partition board 21. A heat exchanger fin 15 is arranged in frame 22 so that refrigerant can vertically pass therethrough, and another heat exchanger fin 13 is arranged between the upper and lower frames 24, 23, respectively, so that the air can horizontally pass therethrough. These frames 22, 23, 24 form a single unit of the boiling refrigerant-type cooling system. A fixed number of units, thus constructed, may be combined with partition boards 21 placed therebetween. An airtight condensing refigerant chax:ber 1 formed in the base of the airtight container 19 communicates with the condensing refrigerant chamber 8 enclosed within the frame 22 which hold the heat exchanger fin 15 over which refrigerant passes vertically. A cooling chamber 9 with openings open to the outside air is formed around the heat exchanger fin 13 to allow air to pass horizontally. The condensing refrigerant chambers 8 and the cooling chambers 9 are installed alternately with each other to permit efficient heat transfer. The laminated body that comprises the airtight container 19 is sandwiched between and supported by side boards 20. The electrical apparatus, when dipped in refrigerant, is held in the boiling refrigerant chamber 1 formed by an opening 27 in the lower portion of each partition board 21, the space below each heat exchanger fin 15 and the space in each lower frame 23. When the refrigerant boils, the vaporized refrigerant passes through the condensing chambers 8 to an air reservoir 10 formed by the opening 28 in the upper portion of each partition board 21, the space above each heat exchanger fin 15 and the space in each upper frame 24.

When the airtight container 19 is formed, at least the partition board 21, and the frames 22, 23, 24 constituting the combined body are simultaneously brazed under predetermined conditions in brazing facilities. Airtight terminals for leading out the leads of the electric apparatus being cooled are airtightly fitted in the lead-out holes 26 of both side boards 20.

The frames 22, 23, 24 and boards 20, 21 are prepared from readily available brazing materials. The members according to this invention can be assembled and brazed through a simple process, and the system as a whole can be made lightweight. Uniform airtight junctions are thus achievable without welding work which requires time-consuming man-hours. With this invention product reliability is improved, production costs are reduced, and foreign matter such as spatters from welding or chips from butting the members are prevented from penetrating into the airtight container. Labor time can be reduced further if the outlets 25 are brazed simultaneously with the brazing of the other members.

What is claimed is:

1. A boiling refrigerant-type cooling system for cooling an electric apparatus, said system comprising:
   a first substantially flat side board having a lower portion with a sealable opening therein;
   a plurality of substantially identical and substantially flat partition boards each having an outer periphery aligned with the periphery of said first side board plate, each of said partition boards having a lower portion with a first hole therein and an upper portion with a second hole therein and spaced from said first hole, each of said partition boards comprised of an aluminum core precoated with solder, a first one of said partition boards abutting the first surface of said first side board, said first hole of said partition board aligned with the sealable opening of said first side board;
   a first frame member comprised of an elongated rim-like material having a U-shaped cross section and comprised of an aluminum core precoated with solder, said rim-like material of said first frame being bent in an endless annular loop substantially aligned with the periphery of said partition boards, said first frame member abutting a surface of said first partition board opposite the surface of said first partition board abutting said first side board;
   a second partition board abutting a side of said first frame member opposite said first partition board;
   a second member and a third frame member, said second and third frame members being comprised of said elongated rim-like material, said rim-like material of said second frame member being bent in an endless annular loop dimensioned to circumscribe the first hole of said partition boards, said rim-like material of said third frame member being dimensioned to circumscribe the second hole of said partition boards, said second frame member being aligned with said first hole of said partition boards and abutting a surface of said second partition board opposite said first frame member, said third frame member aligned with said second hole of said partition boards and abutting the surface of said second partition board opposite said first frame member;
   a third partition board abutting a side of said second and third frame members opposite said second partition board;
   a second substantially flat side board having a first surface and a lower portion with a sealable opening therein aligned with the first hole of said partition boards, said second side board plate facing a surface of said third partition board opposite said second and third frame members; and
   said side board plates, said partition boards and said first, second and third frame members being joined by brazing to form an airtight refrigerant containing chamber aligned with said first holes of said partition boards in which the electrical apparatus is disposed and electrically connected through said openings in said first and second side boards, an airtight refrigerant condensing chamber in flow communication with the refrigerant containing chamber, an airtight vapor reservoir in flow communication with said airtight condensing chamber and aligned with said second holes of said partition boards, and a cooling chamber open to atmosphere and adjoining said refrigerant condensing chamber.

2. The system according to claim 1 wherein said refrigerant condensing chamber includes a heat exchanger fin.

3. The system according to in claim 2 wherein said cooling chamber includes a heat exchanger fin.

* * * * *